United States Patent [19]

Soma et al.

[11] Patent Number: 4,734,896
[45] Date of Patent: Mar. 29, 1988

[54] BURGLARPROOFING DEVICE FOR A CAR-CARRIED ACOUSTIC APPARATUS

[75] Inventors: Satoshi Soma; Masaru Noguchi, both of Iwaki, Japan

[73] Assignee: Alpine Electronics, Ltd., Japan

[21] Appl. No.: 902,754

[22] Filed: Sep. 2, 1986

[30] Foreign Application Priority Data

Sep. 6, 1985 [JP] Japan ................................. 60-198057

[51] Int. Cl.⁴ ............................................. G08B 13/14
[52] U.S. Cl. .............................. 340/568; 307/10 AT; 340/571; 340/825.31
[58] Field of Search ................... 340/568, 825.31, 571; 307/10 AT

[56] References Cited

U.S. PATENT DOCUMENTS 4,327,353 4/1982 Beard et al. .................. 307/10 AT
4,494,114 1/1985 Kaish .............................. 340/825.31
4,604,708 8/1986 Lewis ............................. 340/825.31

Primary Examiner—Glen R. Swann, III
Attorney, Agent, or Firm—Guy W. Shoup

[57] ABSTRACT

A burglarproofing device for a car-carried acoustic apparatus prevents operation of the car-carried acoustic apparatus if the apparatus is stolen. The device allows only an owner of a car who holds a controller to render the apparatus operative. The controller is in the form of a card having keys for entering a pass number and a memory for storing a pass number thus entered. The pass number is transmitted to the car-carried acoustic apparatus when the controller is inserted into a hole formed in the car-carried acoustic apparatus, and is compared with a verification number stored in discriminating means, and only when coincidence is found, is power made available to the apparatus.

10 Claims, 2 Drawing Figures

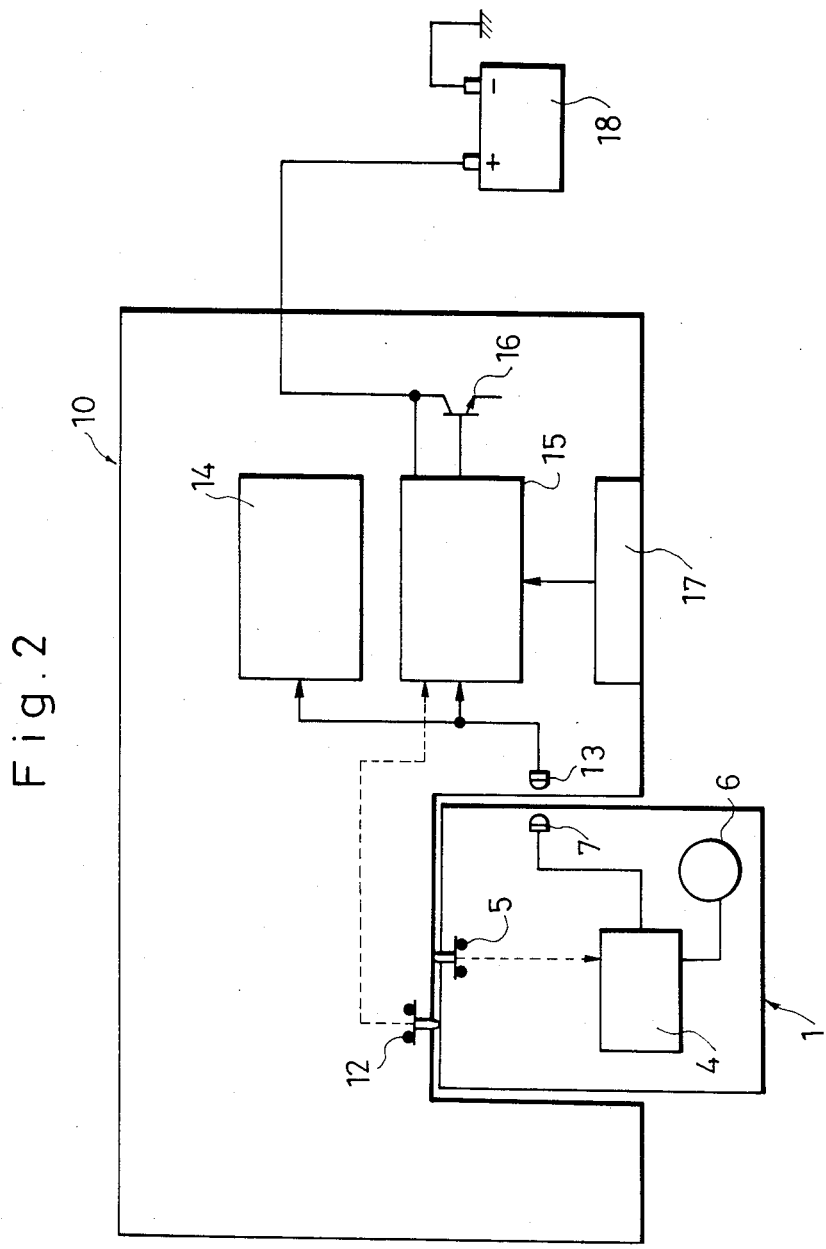

BURGLARPROOFING DEVICE FOR A CAR-CARRIED ACOUSTIC APPARATUS

BACKGROUND OF THE INVENTION

This invention relates to a burglarproofing device for a car-carried acoustic apparatus for preventing a burglary of an expensive car-carried acoustic apparatus such as a compact disk player (CD).

In recent years, cars which carry expensive acoustic (or video) apparatus such as a compact disk player or a video tape recorder have increased so prominently. So far, various devices have been invented in order to prevent a lock of a door of a car from being unlocked or broken, and yet they are not satisfactory. Therefore, many affairs of breaking a lock of a door of a car to remove and steal only a car-carried acoustic apparatus have occurred.

Such devices for preventing a burglary are directed to prevent a burglary of a car itself, and yet there have been proposed no devices for preventing a burglary of a car-carried acoustic apparatus. Accordingly, if a lock of a door of a car is broken, then a car-carried acoustic apparatus can be removed with ease. Since the acoustic apparatus thus stolen can be operated by any other person than an original owner, the stolen item can be sold at a lower price, which may give rise to another burglary.

SUMMARY OF THE INVENTION

It is an object of the present invention to provide a burglarproofing device for a car-carried acoustic apparatus which prevents operation of the car-carried acoustic apparatus if the apparatus is stolen.

In order to attain the object, according to the present invention, a burglarproofing device for a car-carried acoustic apparatus is constituted such that only an owner of a car who holds a controller can put the power source for the car-carried acoustic apparatus to work to render the apparatus operative.

In particular, according to the invention, a burglarproofing device for a car-carried acoustic apparatus comprises a controller in which a pass number or word is stored, and a car-carried acoustic apparatus in which a receiving hole for receiving said controller therein is formed, said controller including a data outputting means, said car-carried acoustic apparatus including a data inputting means located in an opposing relationship to said data outputting means of said controller which is inserted in said receiving hole of said car-carried acoustic apparatus, a discriminating means for discriminating coincidence between the pass number or word received from said data inputting means and a verification number assigned to said car-carried acoustic apparatus and previously stored in said discriminating means, and a switch means responsive to a coincidence signal outputted from said discriminating means for putting the power source to work for said car-carried acoustic apparatus, whereby said car-carried acoustic apparatus is rendered operative only when said controller is inserted into said receiving hold of said car-carried acoustic apparatus and the pass number or word coincides with the verification number.

Thus, upon insertion of the controller into the receiving hole of the car-carried acoustic apparatus, the pass number or word is transmitted from the controller to the car-carried acoustic apparatus and compared with the verification number held by the car-carried acoustic apparatus, and only when coincidence is discriminated, the switch means for controlling the power source is put to work or switched on. Accordingly, should the car-carried acoustic apparatus be stolen, coincidence between a pass number and a verification number cannot be established without the specific controller for the car-carried acoustic apparatus which is possibly still held by an owner of the car and the apparatus. Consequently, a burglary of the car-installed acoustic apparatus can be prevented.

BRIEF DESCRIPTION OF THE DRAWINGS

FIG. 2 is a block diagram of a circuit for putting the power-supply to work for the car-carried acoustic apparatus of FIG. 1.

DESCRIPTION OF THE PREFERRED EMBODIMENT

Figure 1:
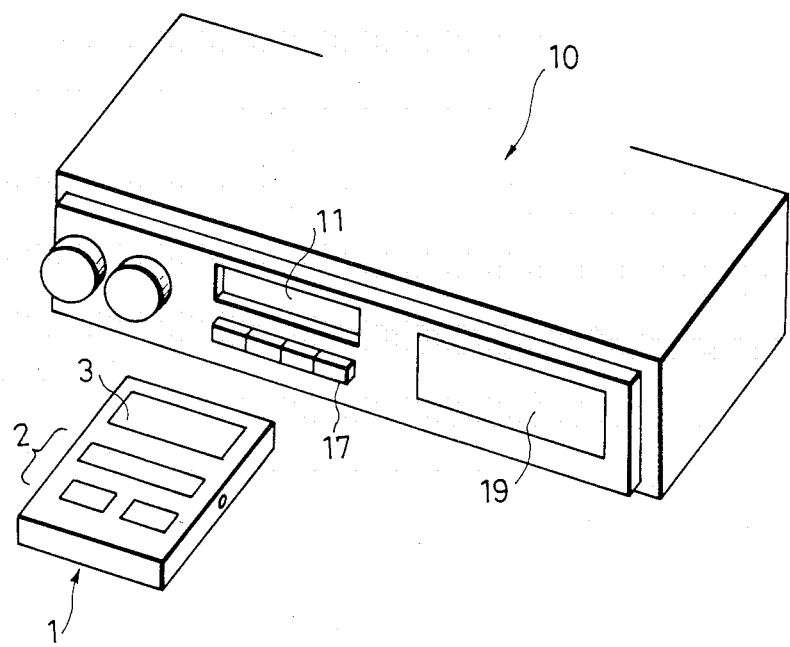
FIG. 1 is a perspective view of an entire burglarproofing device for a car-carried acoustic apparatus according to an embodiment of the present invention.

Referring to FIGS. 1 and 2, a burglarproofing device for a car-carried acoustic apparatus according to the present invention includes a controller 1 in the form of a card which may be brought by an owner of a car not shown. The controller 1 has a certain number of operation keys 2 and a display means 3 on an outer face thereof and contains therein a memory means 4 including a microcomputer, a switch 5, a battery 6, and a data outputting means 7. A car-carried acoustic apparatus 10 such as a compact disk player is fixedly installed in the car and has a receiving held 11 formed therein for receiving the controller 1. The car-carried apparatus 10 has a switch 12 located to be operated by an end portion of the controller 1 as the controller 1 is inserted into the receiving hold 11 of the car-carried apparatus 10, and a data inputting means 13 located in an opposing relationship to the data outputting means 7 of the controller 1 received in the receiving hole 11. The car-carried acoustic apparatus 10 includes a music selecting means 14 for selecting a music in response to data received from the data inputting means 13, a discriminating means 15 in the form of, for example, a microcomputer, having a preset verification number for verification with a pass number or word in the received data to discriminate coincidence between the two numbers, and a switch means 16 which is switched on in responsive to a coincidence signal from the discriminating means 15. The car-carried acoustic apparatus 10 further has a certain number of operation keys 17 and a display means 19 provided on an operation panel thereof.

In the burglarproofing device having such a construction as described above, the controller 1 has either a means for causing a pass number or word entered by means of the operation keys 2 to be stored in the memory means 4 including a microcomputer or a means including a circuit for providing only a predetermined specific pass number or word. The memory means 4 also stores therein selected music data indicative of selected musics to play and an order in which the selected musics are to be played. In this case, if the car-carried acoustic apparatus has an automatic changing function, the sequential numbers of disks and also of musics may be suitably stored. The stored information is maintained because of voltage supply by the self-contained battery 6. Contents of such storage are suitably indicated on the display means 3 for confirmation when they are stored.

Meanwhile, the car-carried acoustic apparatus 10 is operated by way of its operation keys 17 so that an operation mode is selected suitably. The operation keys 17 are also utilized to cause a verification number to be stored into the discriminating means 15. Information stored in the discriminating means 15 is maintained because a voltage is always supplied from a battery 18 carried on the car.

Thus, if the controller 1 is inserted into the receiving hole 11 of the car-carried acoustic apparatus 10, the switch 5 of the controller 1 and the switch 12 of the car-carried acoustic apparatus 10 are both closed. Consequently, the controller 1 transmits the pass number or word and data of selected musics stored in the memory means 4 by way of the data outputting means 7 which may be composed of a light emitting element or the like to the data inputting means 13 of the car-carried acoustic apparatus 10 which may be composed of a light receiving element or the like. Meanwhile, the car-carried acoustic apparatus 10 gets ready for acceptance of data upon closing of the switch 12. Thus, the pass number or word is received by the discriminating means 15, and if coincidence thereof with the verification number stored in prior therein is established, the switch means 16 is switched on so that a voltage is supplied from the car-carried battery 18 to the car-carried acoustic apparatus 10 to put the apparatus 10 into an operational mode. Meanwhile, the selected music data are inputted to the music selecting means 14 so that the car-carried acoustic apparatus 10 may be controlled in accordance with a prescribed order of the selected musics.

By the way, if the car-carried acoustic apparatus 10 having the construction as described above is stolen, no coincidence signal can be produced from the discriminating means 15 because of absence of the controller 1 therefor. Accordingly, the switch means 16 is not put to work at all, and hence the car-carried acoustic apparatus 10 cannot be rendered operative. Besides, even if the car-carried acoustic apparatus 10 and the controller 1 therefor are both stolen together, a voltage supply to the discriminating means 15 is interrupted as it is stolen so that the stored information regarding the verification number is cancelled. Accordingly, even if the acoustic apparatus 10 is installed again in another car and the controller 1 is inserted into the acoustic apparatus 10, a pass number of word will not coincide with a verification number if any. As a result, the switch means 16 will not be put to work at all, and hence the acoustic apparatus 10 cannot be rendered operative.

In this manner, a car-carried acoustic apparatus which has once suffered from burglary cannot operate satisfactorily, and accordingly, a burglary of such an apparatus can be prevented.

It is to be mentioned here that the present invention is not limited to car-carried acoustic apparatus such as a compact disk player and can naturally be applied also to apparatus which involves picture images such as video tape recorders.

What is claimed is:

1. A burglarproofing device for a car-carried acoustic apparatus, comprising:
   a portable controller having memory means in which a pass number or word is sorted and data outputting means connected to said memory means located at a predetermined position on said controller;
   said car-carried acoustic apparatus having a receiving hole for receiving said controller inserted therein, and including data inputting means located at a predetermined position in said receiving hole in opposing relationship to said data outputting means of said controller when said controller is inserted in said receiving hole, discriminating means for discriminating coincidence between the pass number of word read out from said controller through said data outputting means to said data inputting means and a verification number or word previously stored in said discriminating means, and enabling means responsive only to a coincidence signal received from said discriminating means for enabling operation of said car-carried acoustic apparatus,
   whereby said car-carried acoustic apparatus is rendered operative only when said controller has been inserted into said receiving hole of said car-carried acoustic apparatus and the pass number or word thereof coincides with said previously stored verification number or word.

2. A burglarproofing device according to claim 1, wherein said controller further includes a switch means which is closed upon insertion of said controller into said receiving hole of said car-carried acoustic apparatus to allow transmission of data from said data outputting means.

3. A burglarproofing device according to claim 2, wherein said controller is in the form of a card and further includes a battery contained therein.

4. A burglarproofing device according to claim 2, wherein said controller is in the form of a card and further includes operation keys for entering said pass number or word therethrough and a display means for indicating data entered through said operation keys.

5. A burglarproofing device according to claim 1, wherein said car-carried acoustic apparatus further includes operation keys for entering said verification number or word therethrough, the verification number or word entered being stored in said discriminating means, and a display means for indicating data entered by way of said operation keys.

6. A burglarproofing device according to claim 1, wherein said car-carried acoustic apparatus further includes a second switch means which is closed upon insertion of said controller into said receiving hole of said car-carried acoustic apparatus to allow reception of data by said inputting means of said car-carried acoustic apparatus from said data outputting means of said controller.

7. A burglarproofing device according to claim 1, wherein said car-carried acoustic apparatus further includes means for entering said verification number or word therethrough and is connected to be energized by a car-carried battery as its power source whereby if said car-carried acoustic apparatus is disconnected from said car-carried battery, the verification number or word which has been entered through said entering means and stored into said discriminating means is cancelled.

8. A burglarproofing device according to claim 1, wherein the verification number or word is permanently stored in and cannot be cancelled from said discriminating means.

9. A burglarproofing device as defined in claim 1, wherein said car-carried acoustic apparatus is connected to a car power source, and said enabling means includes a switching circuit which connects said car power source to operate said car-carried acoustic apparatus in response to receipt of said coincidence signal.

10. A burglarproofing device as defined in claim 1, wherein said car-carried acoustic apparatus includes a music selection unit which is connected to said data inputting means and is controlled in accordance with music selection data provided from said controller.

* * * * *